US006671953B2

(12) United States Patent
McAninch et al.

(10) Patent No.: US 6,671,953 B2
(45) Date of Patent: Jan. 6, 2004

(54) METHOD OF FABRICATING A CABLE-IN-CONDUIT-CONDUCTOR

(75) Inventors: Michael D. McAninch, Goode, VA (US); James G. Hatmaker, Lynchburg, VA (US)

(73) Assignee: BWX Technologies, Inc., Lynchburg, VA (US)

( * ) Notice: Subject to any disclaimer, the term of this patent is extended or adjusted under 35 U.S.C. 154(b) by 138 days.

(21) Appl. No.: 10/039,856

(22) Filed: Oct. 29, 2001

(65) Prior Publication Data

US 2003/0079343 A1 May 1, 2003

(51) Int. Cl.[7] .......................... H01R 43/00; H01L 39/34
(52) U.S. Cl. ............................ 29/868; 29/599; 505/430
(58) Field of Search .......................... 29/868, 335, 423, 29/599, 605, 606; 427/62, 586, 596; 505/410, 430, 470; 174/125.1

(56) References Cited

U.S. PATENT DOCUMENTS 5,045,527 A * 9/1991 Ikeno et al. ................ 505/410
5,413,753 A * 5/1995 Zahr ........................... 419/36
6,112,531 A * 9/2000 Yamaguchi ................. 62/51.1

* cited by examiner

*Primary Examiner*—Carl J. Arbes
*Assistant Examiner*—Tim Phan
(74) *Attorney, Agent, or Firm*—Robert C. Baraona; D. Neil LaHaye

(57) ABSTRACT

A method for fabricating a cable-in-conduit-conductor for use in superconductor application is described. The system utilizes a work surface with drum means provided at each end. A superconductor cable is fed from a supply source at one end. After the cable is pulled through a tube on the work surface, the leading edge of the cable is bent around one of the drums and returned to the opposite end of the table. This naked length of cable is once again bent around one of the drums and then pulled through another tube on the table. This process is repeated until an acceptable length of superconductor cable is present. Tension means are used in conjunction with a tube mill which compresses the tube-cable combination into a viable cable-in-conduit conductor (CICC). Notably, as this tension-compression is occurring, the naked lengths of cable are eliminated and each separate tube section is joined together to create a uniform CICC.

7 Claims, 5 Drawing Sheets

Step 1. Layout tube assemblies, pull superconductor, and weld tube assembly #1 to the leader Step 1. Layout tube assemblies, pull superconductor, and weld tube assembly #1 to the leader Step 2. Tube assembly #1 processed, pull superconductor backward to remove slack Step 3. Tube assembly #2 in position and welded to the end of tube assembly #1

Step 4. Tube Assembly #2 processed and pull superconductor backward to remove slack Step 5. Tube assembly #3 in position and welded to the end of tube assembly #2

Step 6. Tube assembly #3 processed and pull superconductor backward to remove slack Step 7. Tube assembly #4 in position and welded to the end of tube assembly #3

Step 8. Tube assembly #4 processed and pull superconductor backward to remove slack Step 9. Tube assembly #5 in position and welded to the end of tube assembly #4

Step 10. Tube assembly #5 processed. Remove pulling cable

METHOD OF FABRICATING A CABLE-IN-CONDUIT-CONDUCTOR

FIELD AND BACKGROUND OF THE INVENTION

The present invention relates in general to superconductors and, in particular, to a new and useful apparatus and method of making cable-in-conduit-conductors or CICC's.

Superconducting cables integrated into a metal jacket can be used as windings of coils which create very strong magnetic fields. At present, two previous methods are known to the inventors for the commercial manufacture of such Cable-In-Conduit-Conductor (CICC). The first method involves conventional cable handling equipment used in conjunction with seam welded tube manufacturing equipment. The second method relies upon pre-manufactured tubing, cable and a die block to produce the final product. Each of these prior art methods will be described in greater detail below.

In the first method, superconducting cable is created in a continuous length coil which is, in turn, loaded in a cable payout machine. A metal jacket material, in coiled strip form, is also provided to act as strip material. The jacket material is positioned directly under the superconducting cable proximate the payout machine. The cable and jacket materials are simultaneously fed into a series of rolls in a tube-forming mill. The forming rolls of the mill bend and roll the strip material around the cable to form an encasing tube. The tube is then subjected to a seam welding process so that the edges of the strip material of the jacket are joined to produce a leak tight tubular product. Additional forming rolls after the welding process reduce the diameter of the tube, forcing the strip material into intimate contact with the superconducting cable. Keeping in mind that the shape of the conductor can aid the winding process of the final coil, further forming processes may be used to form the jacket material into a square, oval, rectangular or other cross section as required by the conductor design specification, and the final CICC product is wrapped onto a storage spool until the coil winding process begins (see below).

A major drawback of this first method involves the welding process required, insofar as the superconducting cable may be damaged during this welding. Consequently, the first method described above typically results in CICC product of lower quality in comparison to other known manufacturing processes.

The second method uses pre-manufactured lengths (typically 20 ft.) of either welded or seamless tubing as the jacket material. The jacket material is stacked vertically in a equilateral triangular rack. Superconducting cable is then provided as a continuous length coil which is pulled through the hollow center of the jacket material. This cable pulling operation is started at the bottom of the rack and progresses upward in a helical fashion through each subsequent layer of tubes until the stringing operation is complete. Removing the first two tube sections from the bottom of the rack begins forming of the CICC. The tubes are slid together and joined by an orbital butt weld (over the cable) to produce a leak tight joint. The tubing is then pulled through a die (or series of dies) to produce the desired final shape. Once formed, the final product is wrapped onto a storage spool.

A significant disadvantage of this second manufacturing process results from its rack assembly. The orientation of the rack can limit the efficiency of the manufacturing operation.

SUMMARY OF THE INVENTION

The present invention is drawn to a system for fabricating a cable-in-conduit-conductor. The system has a work surface with superconductor cable distribution means situated on one end of the surface. This distribution means will also serve to guide the cable through a tube placed on the work surface, thereby creating a portion of cable encased within tube. Drum means are located on opposite sides of the work surface, and these serve to assist in bending and redirecting the cable without damaging it. Notably, the cable is bent around the first drum means and returned to across the work surface without pulling the cable through any additional tubes, thereby creating a naked length of cable. In contrast, the second drum means is capable of guiding the naked length of cable into additional tubes on the work surface, thereby creating additional portions of cable encased within tube. Finally, tension means and compression means work together to process the cable encased within tube into a single length of cable-in-conduit conductor (CICC). Additional items, such as collection means for collecting the CICC and/or orbital butt welding apparatus, may also be provided.

The present invention also contemplates a method for creating CICC. Essentially, this method includes pulling a superconductor cable through an appropriate tube situated on a work surface, bending and returning the exposed cable along the work surface, bending and pulling the cable back through a separate tube and finally compressing the cable encased in tube portions to eliminate the exposed lengths of cable while, at the same time, joining each section together. As above, this joining operation may be performed via orbital butt welding, and the pulling and returning operations can be performed numerous times until the desired length of CICC product is produced.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which a preferred embodiment of the invention is illustrated.

DESCRIPTION OF THE PREFERRED EMBODIMENTS

The present invention is a folded manufacturing process and apparatus for efficiently producing very long lengths of CICC using shorter lengths of pre-manufactured welded or seamless tubing in comparison to previously known methods.

Figure 1:
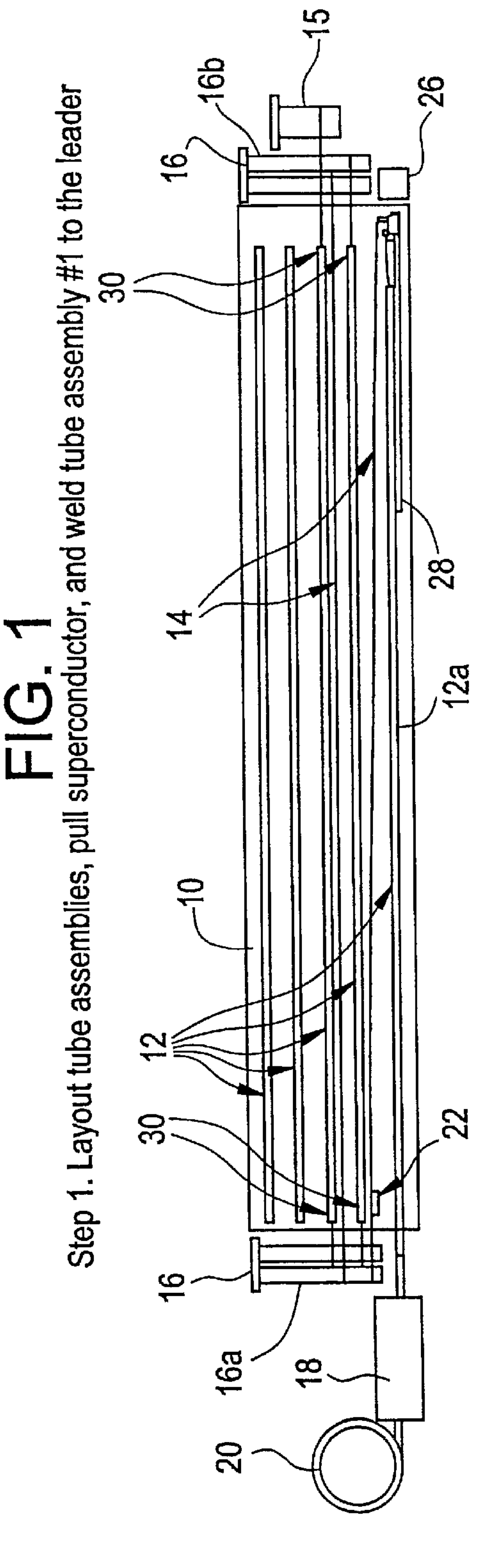
FIG. 1 is a plan view of an apparatus for fabricating a CICC during a first step of the process.

The initial stage of process is illustrated in FIG. 1. The tubing used to jacket the intended CICC product may comprise individual lengths, or the tubing may be made up of a series of tubes welded into tube assemblies 12. In either case, the tubing 12 is of the type used for superconductor construction, and it is most preferably oriented on a horizontal work surface or table 10. Cable management drums 16*a*, 16*b* are provided at opposite ends of the table.

Notably, drums 16 serve three primary functions. First, these drums control the minimum bending radius of the superconductor cable so as not to induce work hardening and thereby lower the RRR value of the cable. Second, the drums provide a means of controlling the position of the cable during the stringing and pulling operations. Third, the hairpin turn caused by wrapping cable 14 around drum 16 eliminates any twisting of the cable that would tend to change the twist pitch of strands within the cable bundles of the super conductor cable 14.

The superconductor cable 14 used in this invention most typically comprises a plurality of smaller cable wires or strands that are twisted together at a specified twist pitch and bundled into a unitary element hereafter referred to simply as superconductor cable 14. Superconductor cable 14 supplied by a payout spool 15 at one edge of the table 10. As with the tubing mentioned above, those familiar in the superconducting arts will readily appreciate the range of appropriate materials.

In order to create CICC according to the present invention, superconductor cable 14 is pulled through one of any number of tube assemblies 12. In effect, this pulling operation will serve to surround the cable with the tubing. Once the cable exits the end of assembly 12*a*, it is wrapped in a hairpin fashion around cable management drums 16*a*.

Once the first hairpin turn is completed, the leading edge of cable 14 is returned back down the table 10 to the end with payout spool 15. During this returning step, the cable is positioned between or proximate to the tube assemblies 12, rather than inside of them. The purpose of this "naked length" cable return operation is to allow the tube assemblies 12 to be indexed across the table for processing. It also prevents the need to rotate or flip the assemblies 12 in order to align the mating ends of each assembly (see below).

After the cable 14 has been returned to the payout-spool-end of the table, it is also wrapped in a hairpin fashion around drum 16*b* for the same reasons outlined above. The cable pulling process is then repeated, with the cable 14 being pulled through a different tube assembly 12 and then back down the table as a "naked length". As above, the cable 14 must be wrapped around the drums 16*a*, 16*b*, and the pulling and returning processes are repeated until all of the superconducting cable is on the work table (i.e., one half of the cable length being housed in tube assemblies and remaining half interposed between the drums 16*a*, 16*b* as naked lengths).

The CCIC is actually formed during the milling step of the operation. This step involves feeding the first or last tube assembly/pulled cable combination upon which a pulling cable operation was performed (along with the subsequent naked length of cable, as well as all the remaining tube/cable combinations and associated naked cable lengths) into a tube forming mill 18, or series of die blocks known to those skilled in the art.

Forming mill 18 (or die blocks) reduces the diameter of the tubing assembly 12 around the cable 14 into a unitary conductor in which the cable and the tubing are in intimate contact. Forming mill 18 also shapes the conductor into a final, desired profile (typically either a square or rectangle). The finished conductor is wrapped on a storage spool 20 for future use/processing.

As the milling process progresses, the both the cable and tubing diameter will be reduced and a corresponding elongation in the length of each develops. However, this rate of elongation will be greater for the tubing in comparison to the cable because the tubing undergoes more compression within the mill relative to the cable (stated differently, the cable is unaffected by mill forming until it reaches the roll or die set that actually forces the tubing down onto the cable).

More importantly, the tubing will elongate backwards along the length of the cable during the milling process. However, a kink or sharp bend in the cable would cause irreparable harm to the cable because such an impediment would prevent the passage of the elongated tubing over the cable. Therefore, means to prevent such kinking must be employed in order for the invention to function efficiently.

Ideally, this means for preventing kinking comprises a combination of a cable tensioning device 26 (CTD), a cable "soft clamp" device (CSCD) 22 and a cable inlet/outlet guide device (CIOGD) 30. CTD 26 applies tension to the cable 14 during processing while allowing the cable to move forward into mill 18 at the appropriate speed. However, for CTD 26 to function properly, cable 14 must be firmly anchored in order to counteract the applied tension of the CTD 26 in way that does not damage the cable. Accordingly, CSCD 22 is provided to clamp and stay the cable in place. Finally, CIOGD 30 is used to allow relative motion between the cable 14 and the outermost edge of the backwards-elongating tube end between tensioning operations (i.e., during milling). The CIOGD 30 should operate in a manner that does not cut or damage the cable 14.

Figure 2:
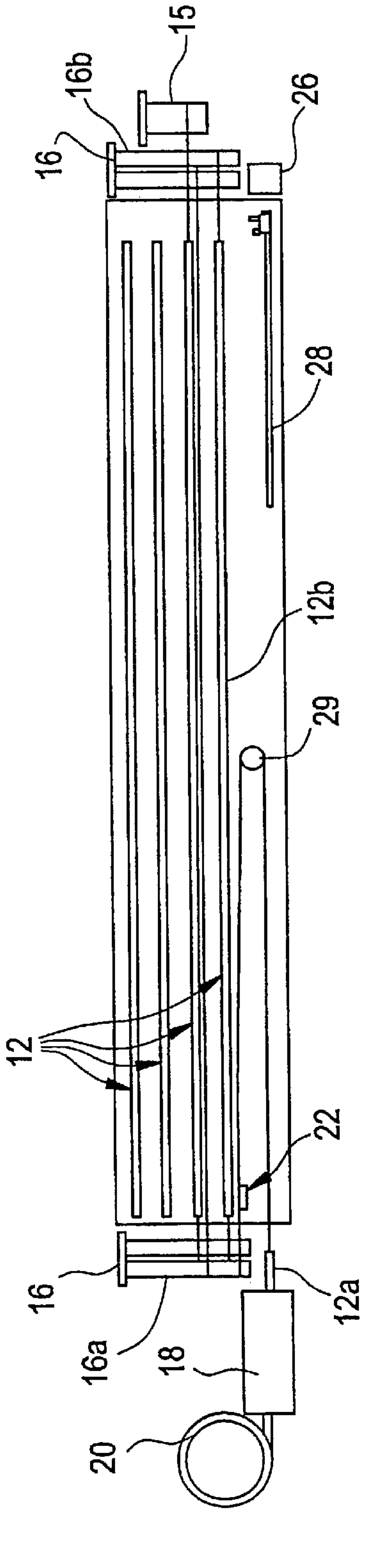
FIG. 2 is a view similar to FIG. 1 during a second step of the process.

FIG. 2 illustrates the relative positioning of the tube assemblies and other elements after almost all of the first tube assembly 12*a* has been mill processed. Note that the remaining cable 14 (i.e., the cable which has not yet been milled) is removed from CTD 26 and soft clamp device 22 via loop 29 (see below).

Figure 3:
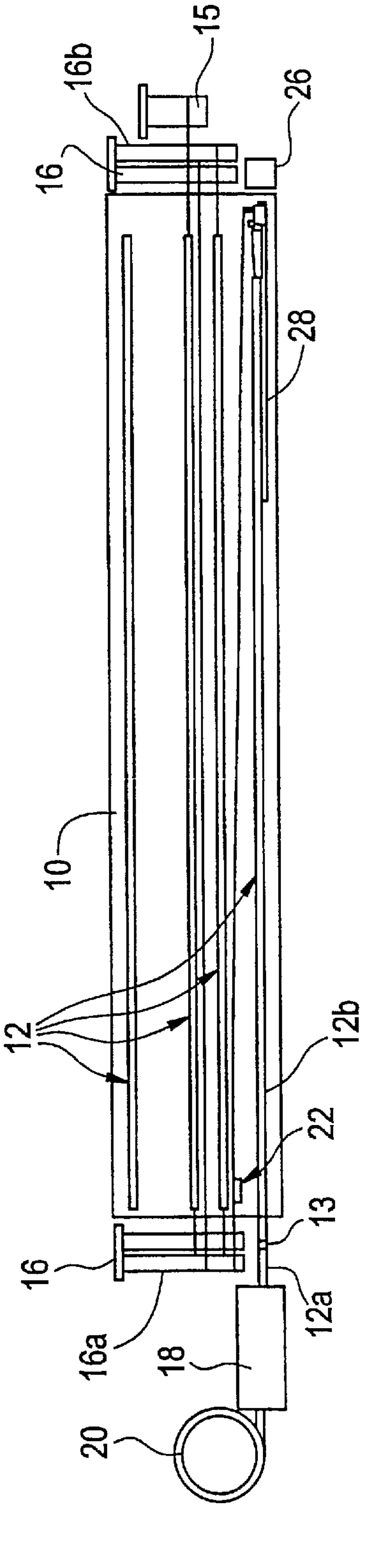
FIG. 3 is a view similar to FIG. 1 during a third step of the process.

The slack removal step should be performed next, as seen in FIG. 3. Essentially, in this step, loop 29 is used to capture the naked length of cable 14 and then moved in the opposite direction from the pulling operation (i.e., toward mill 18) so as to draw the next tube assembly 12 proximate to the portion of tube assembly 12*a* that has not yet been milled, thereby eliminating the naked length cable between the first tube assembly 12*a* and the second tube assembly. Once the second tube assembly is proximate to the first, almost completely milled tube assembly 12*a*, the two are joined together to form a leak tight seal 13 using an orbital butt weld or any other appropriate means for joining the tubing assemblies 12. Preferably, this slack removal step (as well as the welding) is performed prior to further milling of subsequent tube assemblies, thereby simplifying the welding/joining procedure.

Ideally, the weld is a full penetration butt weld. Such a weld can be formed without damaging the underlying cable through the use of a consumable centering device. Such a device may include, but is not limited to, a corrugated foil or other such implements known in the art. A corrugated foil having dimensions of 0.001"×1.5"×2" seems to work particularly well. The foil is wrapped around the cable and inserted between the cable and either tubing assembly prior to butt welding so as to protect the cable. As the name implies, the foil is consumed during the welding operation, thereby avoiding formation of any significant irregularities in the final CICC product.

Figure 4:
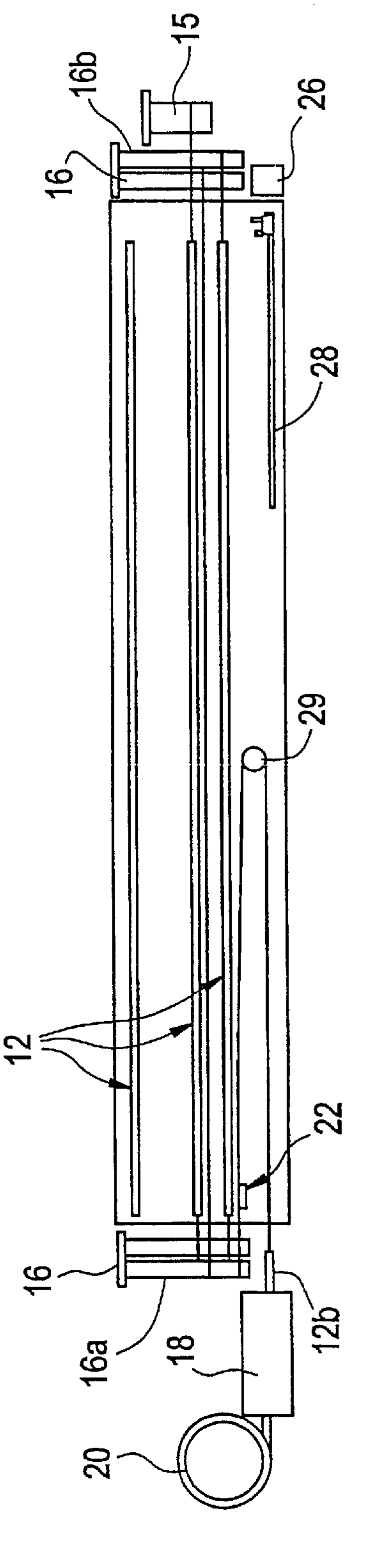
FIG. 4 is a view similar to FIG. 1 during a fourth step of the process.
Figure 5:
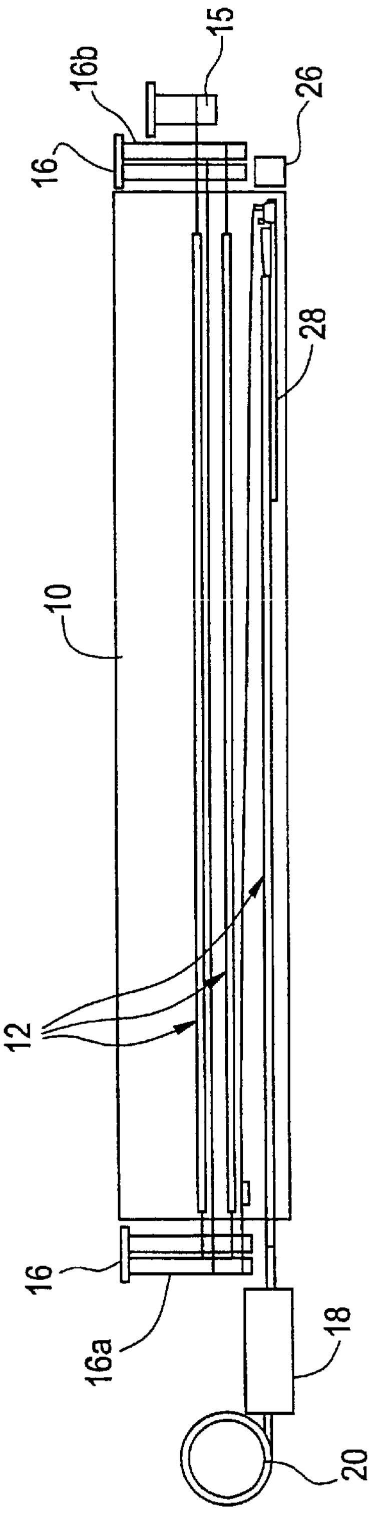
FIG. 5 is a view similar to FIG. 1 during a fifth step of the process.
Figure 6:
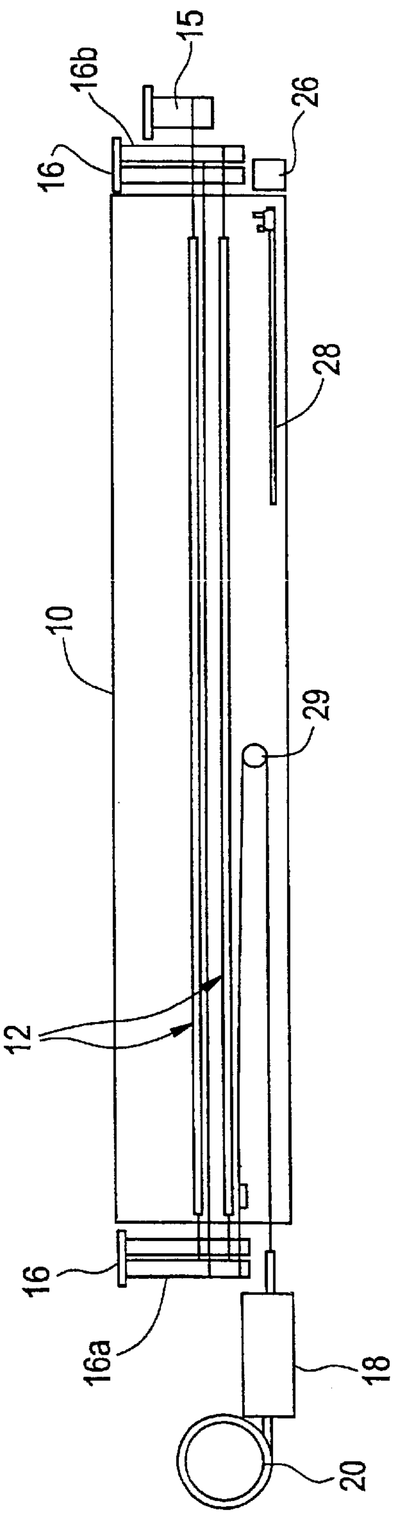
FIG. 6 is a view similar to FIG. 1 during a sixth step of the process.
Figure 7:
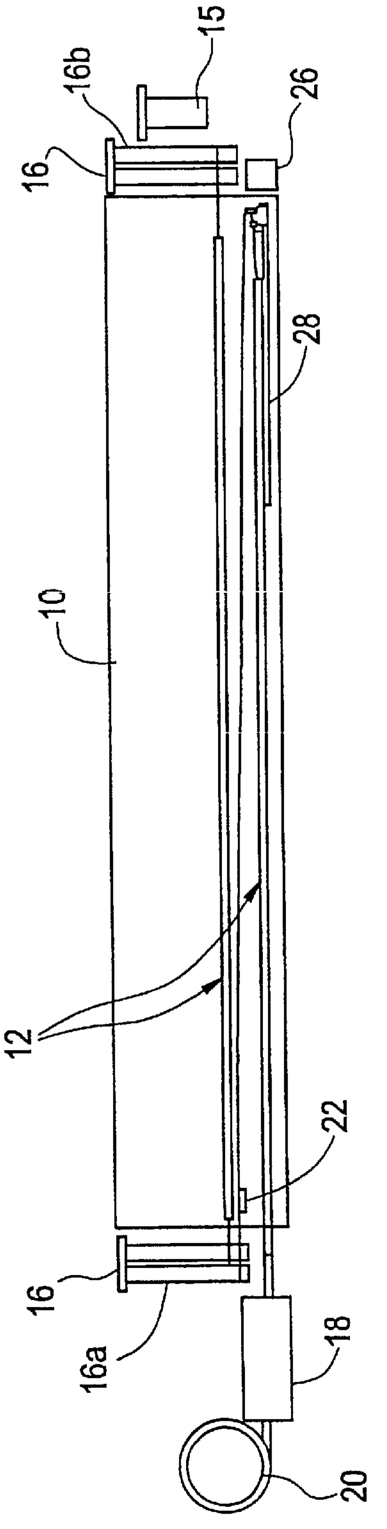
FIG. 7 is a view similar to FIG. 1 during a seventh step of the process.
Figure 8:
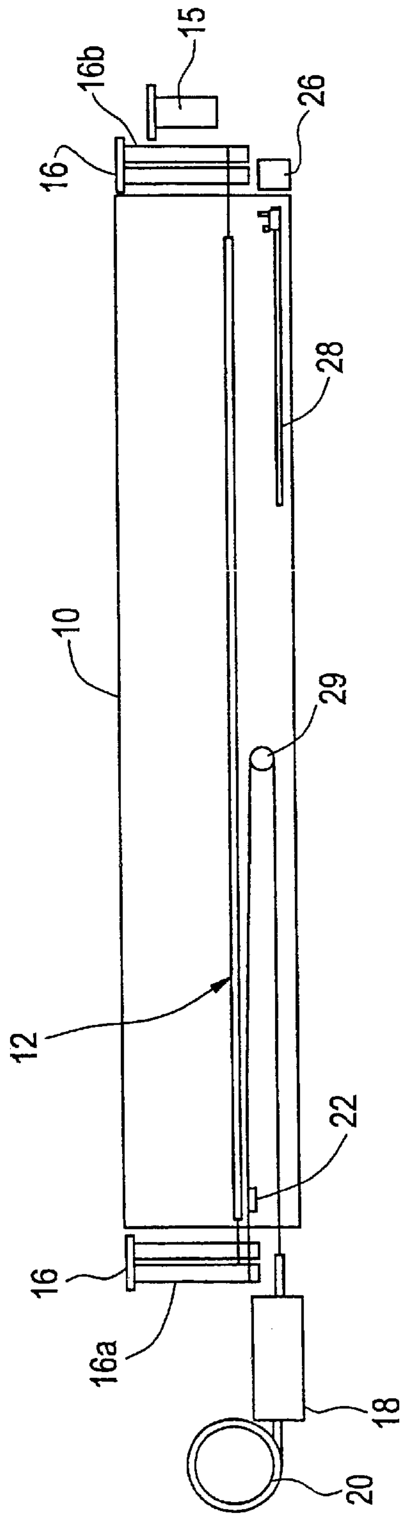
FIG. 8 is a view similar to FIG. 1 during an eighth step of the process.
Figure 9:
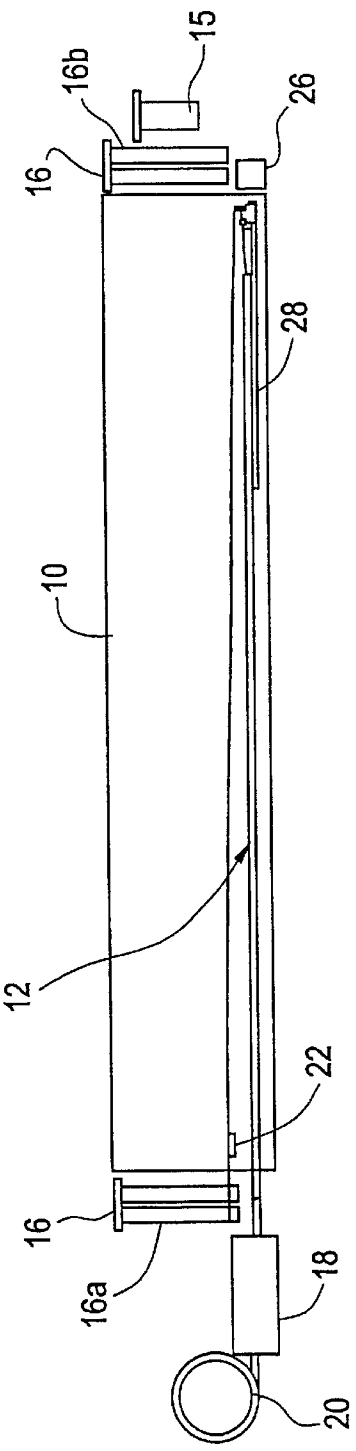
FIG. 9 is a view similar to FIG. 1 during a ninth step of the process.
Figure 10:
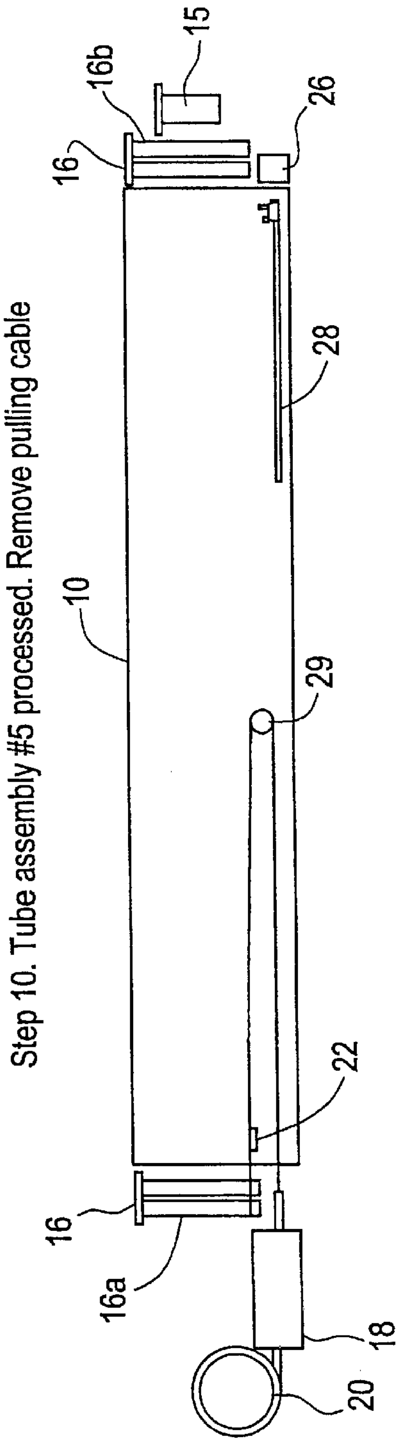
FIG. 10 is a view similar to FIG. 1 during a final step of the process.

As seen in FIG. 4, the second tube assembly is processed through the tube forming mill or die blocks (FIG. 4) and taken up on the storage spool 20. The process is repeated until the desired length of CICC has been fabricated. For the sake of completeness, these subsequent milling and slack removal steps are shown in FIGS. 5–10.

During the forming operation of each tube/tube assembly, the tensioning device 26 and soft clamp device 22 are used to control the amount of back tension applied to the end of the cable exiting the tube being formed. Tension is applied to keep the cable taut, allowing the tubing to slide backward along the cable as it elongates from the forming operation.

The soft clamp 22 holds the cable in a fixed position to provide the resistance necessary for operation of CTD 26. The soft clamp also monitors the load being applied to the superconductor cable and can be equipped with automated monitors that would shutdown the process in the event of over-tensioning and before the cable was damaged. Cable carriage 24 can be used in conjunction with softclamp 22 and CTD 26 to provide further safeguards against damaging the cable. As will be appreciated by those familiar with the art, CICC cables must have consistent and uniform construction for proper operation.

The work surface 10 can be constructed of any materials that adequately support the tubing 12 and cable 14. The tubes/cable can be positioned either vertically or horizontally, provided they are properly supported and the remaining elements of the invention are appropriately aligned.

The process can produce straight length sections of a specified length or a continuous length product accumulated on a storage spool. The pulling/shaping operation of the CICC can be done with a forming mill or drawn through a fixed die (or set of dies).

The individual length of the tubing assemblies 12 are determined by (1) the length of the manufacturing facility, and (2) the shipping limitations for incoming products. Similarly, the spatial constricts of the manufacturing facility will ultimately determine the intermediate length of the tubing prior to the insertion of the cable, although a table 10 is expected to have a length anywhere from eighty feet to several hundred feet.

For straight length tubing, the current maximum allowable shipping length is 100–120 feet. If the material is received as a coil, the length is limited by the tubing manufacturer's coiling process, although it is expected that this length could easily be exceed 1,000 feet.

One of the key advantages of this invention is that the process can be easily modified to suit the incoming material length. In turn, straight tubular sections can have any length, so long as the manufacturing facility permits, and tubing can be purchased in straight lengths of up to 100–120 feet, or in coil form (straightened once at the site) as long as required. This procedure, along with the use of a seamless tubular product, significantly reduces the number and total linear feet of welds in the final product. A reduction in the number of and length of welds significantly reduces costs, as well as the potential for damage to the relatively fragile superconductor cable itself. Furthermore, to the extent that CICC must be durable and leak resistant (in order to create a barrier for the liquid helium), the ability to limit the number and total linear feet of welds should also significantly enhance the quality of the product.

Additionally, this process enables the production of very long lengths of CCIC within a facility of any size. In turn, this reduced facility footprint will markedly reduce costs (in terms of construction and/or maintenance of the physical plant).

Because the primary limiting factor of this method is based upon the length of the table 10, it is possible to construct large lengths of tubing assemblies via orbital welding prior to pulling the superconducting cable through these assemblies. By way of example rather than limitation, if a 300 foot work surface were provided, one could arrange ten groupings of three 100 foot straight tubes. Each set of three would be welded prior to the pulling operation (resulting in 20 welds being performed without the cable in place), and only 9 additional welds would be required using this method (and yields a final CICC product of over 3,000 feet in length).

Likewise, if a single piece, non-tubular jacket material is used, obviously that material must be joined together (via welding) in order to form a tube assembly that can be integrated into a CICC product (see above for prior art methods of using such material). In the previously known methods, the welding was by necessity performed in close proximity to the superconducting cable. However, in the present invention, the tubes can be preformed on-site prior to the cable pulling operation (with reference to the example above, the non-tubular jacket material is formed into tubes that would be incorporated into the example above).

In either case, it becomes plain to see that, using this procedure, a vast majority of the inspection, repair and removal of defective welds can be done without any risk of damage to the superconducting cable. Given that any weld made over the superconductor necessarily puts the entire length of conductor at risk to damage or loss (since the superconductor cable cannot be spliced or repaired if damaged by the welding process), another advantage of this invention is its ability to construct large lengths of CICC with minimal risk to the cable itself.

Yet another advantage of the present invention resides in its unique ability to create long lengths of CICC without the need to rotate or align mating ends of the tube assemblies during construction. Stated differently, by alternating the pulling of cable inside of a tube and then continuously returning the cable as a naked length, tubes that are longer in length than the actual facility in which they are processed can be made without the further manipulation of the assemblies. In contrast, previously known methods (especially the aforementioned rack-assembly method described above) were not capable of running the assemblies through the process without the physical manipulation and further alignment of specific ends of the tube assemblies.

Thus, in the present invention, the combination of the 2 hairpin turns used during the superconductor stringing eliminates the twist created if it were wrapped around a spool hub. Elimination of this spool hub prevents any change to the twist pitch of the cable strands that might adversely effect the performance of the resulting CICC product.

While a specific embodiment of the invention has been shown and described in detail to illustrate the application of the principles of the invention, it will be understood that the invention may be embodied otherwise without departing from such principles.

We claim:

1. A method of fabricating a cable-in-conduit-conductor, comprising:

(a) providing a plurality of tubes onto a flat work surface;

(b) providing a continuous supply of superconductor cable at one end of the work surface;

(c) pulling the superconductor cable into and through a first tube to create a first portion of encased superconductor cable;

(d) receiving and bending the superconductor cable exiting the first tube at an opposite end of the work surface from the supply of superconductor cable, the bending step being performed in a manner that does not harden and twist of the superconductor cable;

(e) returning a naked length of superconductor cable toward an end of the work surface opposite the receiving and bending described in step (d);

(f) receiving and bending the naked length of superconductor cable in a manner that does not harden and twist of the cable, and then pulling the naked length of superconductor cable into and through a second tube, the second tube being oriented substantially parallel to the first tube, to create a second portion of encased superconductor cable; and (g) tensioning and compressing the first portion of encased superconductor cable so as to eliminate the naked length of superconductor cable, joining the first portion of encased superconductor cable with the second portion of encased superconductor cable, and subsequently tensioning and compressing the second portion of encased superconductor cable so as to form a single unitary length of cable-in-conduit conductor.

2. A method according to claim 1, wherein the work surface has a horizontal orientation.

3. A method according to claim 1, wherein step (g) includes orbital butt welding.

4. A method according to claim 1, wherein step (a) further comprises creating a plurality of tubes from a non-tubular material and inspecting the tubes immediately prior to the step of pulling the superconductor cable into and through the tube.

5. A method according to claim 1, further comprising the step of, subsequent to step (g), collecting the length of cable-in-conduit conductor onto a coil as the cable-in-conduit conductor is formed.

6. A method according to claim 1, wherein steps (c) through (f) are repeated upon so as to create an alternating series of: portions of encased superconductor cable and naked lengths of superconductor cable within the superconductor cable that has been provided to the work surface; and wherein step (g) comprises: tensioning and compressing each portion of encased superconductor cable so as to eliminate each naked length of superconductor cable, while concurrently joining each portion of encased superconductor cable to an adjacent portion of encased superconductor cable, so as to form a single unitary length of cable-in-conduit conductor.

7. A method according to claim 6, further comprising the step of, subsequent to step (g), collecting the length of cable-in-conduit conductor onto a coil as the cable-in-conduit conductor is formed.

* * * * *